(12) United States Patent
Takano et al.

(10) Patent No.: US 8,501,394 B2
(45) Date of Patent: Aug. 6, 2013

(54) SUPERFINE-PATTERNED MASK, METHOD FOR PRODUCTION THEREOF, AND METHOD EMPLOYING THE SAME FOR FORMING SUPERFINE-PATTERN

(75) Inventors: Yusuke Takano, Kakegawa (JP); Jin Li, Kakegawa (JP); Tomonori Ishikawa, Kakegawa (JP); Go Noya, Kakegawa (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 250 days.

(21) Appl. No.: 12/864,529

(22) PCT Filed: Jan. 27, 2009

(86) PCT No.: PCT/JP2009/051234
§ 371 (c)(1),
(2), (4) Date: Jul. 26, 2010

(87) PCT Pub. No.: WO2009/096371
PCT Pub. Date: Aug. 6, 2009

(65) Prior Publication Data
US 2010/0308015 A1   Dec. 9, 2010

(30) Foreign Application Priority Data
Jan. 28, 2008   (JP) .................................. 2008-016552

(51) Int. Cl.
*G03F 7/26*   (2006.01)
(52) U.S. Cl.
USPC .......................................................... 430/322
(58) Field of Classification Search
USPC .................................. 430/322, 323, 324, 314
See application file for complete search history.

(56) References Cited

U.S. PATENT DOCUMENTS

| | | | |
|---|---|---|---|
| 4,491,628 A | 1/1985 | Ito et al. | |
| 4,770,974 A | 9/1988 | Hiraoka | |
| 4,818,611 A | 4/1989 | Arai et al. | |
| 4,869,858 A | 9/1989 | Funayama et al. | |
| 4,965,058 A | 10/1990 | Funayama et al. | |

(Continued)

FOREIGN PATENT DOCUMENTS

| | | |
|---|---|---|
| EP | 1 164 435 A1 | 12/2001 |
| JP | 2-5522 A | 1/1990 |

(Continued)

OTHER PUBLICATIONS

Notice of Allowance and Fee(s) Due mail date Aug. 24, 2011 for U.S. 12/368,720.

(Continued)

*Primary Examiner* — Brittany Raymond
(74) *Attorney, Agent, or Firm* — Sangya Jain

(57) ABSTRACT

There is provided a method for forming a superfine pattern, which can simply produce a superfine pattern with high mass productivity.

The method comprises the steps of forming a first convex pattern, on a film to be treated, forming a spacer formed of a silazane-containing resin composition on the side wall of the convexes constituting the first convex pattern, and forming a superfine pattern using as a mask the spacer or a resin layer disposed around the spacer. The spacer is formed by curing an evenly coated resin composition only in its part around the first convex pattern. According to this method for pattern formation, unlike the conventional method, a superfine pattern can be formed.

10 Claims, 2 Drawing Sheets

U.S. PATENT DOCUMENTS

| | | | |
|---|---|---|---|
| 4,999,280 | A | 3/1991 | Hiraoka |
| 5,292,830 | A | 3/1994 | Funayama et al. |
| 5,350,660 | A | 9/1994 | Urano et al. |
| 5,770,260 | A | 6/1998 | Fukuyama et al. |
| 5,770,271 | A | 6/1998 | Imamura |
| 5,843,624 | A | 12/1998 | Houlihan et al. |
| 5,922,411 | A | 7/1999 | Shimizu et al. |
| 5,976,618 | A | 11/1999 | Fukuyama et al. |
| 6,221,562 | B1 | 4/2001 | Boyd et al. |
| 6,447,980 | B1 | 9/2002 | Rahman et al. |
| 6,686,124 | B1 | 2/2004 | Angelopoulos et al. |
| 6,723,488 | B2 | 4/2004 | Kudo et al. |
| 6,737,492 | B2 | 5/2004 | Kang et al. |
| 6,767,641 | B1 | 7/2004 | Shimizu et al. |
| 6,790,587 | B1 | 9/2004 | Feiring et al. |
| 6,818,258 | B2 | 11/2004 | Kaneko et al. |
| 6,849,377 | B2 | 2/2005 | Feiring et al. |
| 6,866,984 | B2 | 3/2005 | Jung et al. |
| 6,916,590 | B2 | 7/2005 | Kaneko et al. |
| 6,995,056 | B2 | 2/2006 | Lee et al. |
| 7,015,144 | B2 | 3/2006 | Hong et al. |
| 7,053,005 | B2 | 5/2006 | Lee et al. |
| 7,125,926 | B2 | 10/2006 | Satoh et al. |
| 7,179,537 | B2 | 2/2007 | Lee et al. |
| 7,344,603 | B2 | 3/2008 | Shimizu et al. |
| 7,521,170 | B2 | 4/2009 | Rahman et al. |
| 8,084,186 | B2 | 12/2011 | Abdallah et al. |
| 2001/0035343 | A1 | 11/2001 | Kamijima |
| 2002/0064936 | A1 | 5/2002 | Park et al. |
| 2003/0204035 | A1 | 10/2003 | De et al. |
| 2004/0102048 | A1 | 5/2004 | Yamaguchi et al. |
| 2005/0069814 | A1 | 3/2005 | Endo et al. |
| 2005/0164133 | A1 | 7/2005 | Rangarajan et al. |
| 2005/0244995 | A1* | 11/2005 | Fukuchi et al. ............ 438/30 |
| 2007/0077524 | A1* | 4/2007 | Koh et al. ............ 430/314 |
| 2008/0064213 | A1* | 3/2008 | Jung ............ 438/696 |
| 2008/0160459 | A1 | 7/2008 | Lin |
| 2008/0166665 | A1 | 7/2008 | Jung |
| 2008/0193880 | A1 | 8/2008 | Nishibe et al. |
| 2008/0292995 | A1 | 11/2008 | Houlihan et al. |
| 2009/0042148 | A1 | 2/2009 | Padmanaban et al. |
| 2009/0142701 | A1 | 6/2009 | Hsu et al. |
| 2009/0246691 | A1 | 10/2009 | Rahman et al. |
| 2009/0253081 | A1 | 10/2009 | Abdallah et al. |
| 2009/0258318 | A1 | 10/2009 | Chan |
| 2009/0280435 | A1 | 11/2009 | McKenzie et al. |
| 2010/0203299 | A1 | 8/2010 | Abdallah et al. |

FOREIGN PATENT DOCUMENTS

| | | |
|---|---|---|
| JP | 5-13384 A | 1/1993 |
| JP | 6-216084 | 8/1994 |
| JP | 7-130631 A | 5/1995 |
| JP | 2000-181069 A | 6/2000 |
| JP | 2001-316863 A | 11/2001 |
| JP | 2003-31486 A | 1/2003 |
| JP | 2005-107226 A | 4/2005 |
| WO | WO 2005/098545 A1 | 10/2005 |

OTHER PUBLICATIONS

U.S. Appl. No. 12/368,720, filed Feb. 10, 2009, Abdallah et al.
English Language Abstract from JPO of JP 2-5522 A.
Form PCT/ISA/220, Form PCT/ISA/210, Form PCT/ISA/237 for PCT/IB2009/005145 mailed Oct. 19, 2009, which corresponds to U.S. Appl. No. 12/368,720.
Chris Bencher, "SADP: The Best Option for ≦32nm NAND Flash", Nanochip Technology Journal, Issue Two 2007, pp. 8-pp. 13.
Mircea Dusa et al., "Pitch Doubling Through Dual Patterning Lithography Challenges in Integration and Lithography Budgets", SPIE vol. 6520, pp. 65200G-1-pp. 65200G-10 (2007).
Office Action mail date Nov. 10, 2010 for U.S. Appl. No. 12,368,720.
Notice of Allowance and Fee(s) Due mail date Jun. 6, 2011 for U.S. Appl. No. 12/368,720.

* cited by examiner

SUPERFINE-PATTERNED MASK, METHOD FOR PRODUCTION THEREOF, AND METHOD EMPLOYING THE SAME FOR FORMING SUPERFINE-PATTERN

This application is a United States National Stage Patent Application under 35 U.S.C. §371 of International Patent Application No. PCT/JP2009/051234, filed Jan. 27, 2009, which claims priority to Japanese Patent Application No. 2008-016552, filed Jan. 28, 2008, the contents of both documents being hereby incorporated herein by reference.

TECHNICAL FIELD

This invention provides a method for forming a pattern, particularly a method for forming a pattern on a base substrate in the production of semiconductor devices. The present invention also provides a method for forming a patterned mask used in the pattern formation.

BACKGROUND ART

In a process of producing a semiconductor device, a film to be treated (for example, an insulating film or an electroconductive film) is generally formed on a base substrate. An etching mask is formed on the film, and a pattern having predetermined dimension and shape is formed by etching in the film to be treated. The above procedure is repeated a plurality of times.

In the step of forming a pattern in the film to be treated, a lithography technique is generally used wherein the so-called exposure step, development treatment step and the like are carried out using a photosensitive material called a photoresist (hereinafter referred to simply as "resist").

When the lithography technique is used, a pattern of the film to be treated is generally formed according to the following procedure. Specifically, a resist film is formed by coating on a film to be treated, and the resist film in its predetermined region is exposed imagewise through an exposure mask (=reticle). Next, the resist film after the exposure is developed, and the exposed or unexposed part is removed to form a resist pattern. A pattern of the film to be treated is then formed, for example, by drying etching using this resist pattern as a mask.

In recent years, when a resist film is exposed, short wavelength exposure light should be used, for example, from the viewpoints of improved resolution and throughput. For example, light sources which emit ultraviolet light, for example, KrF excimer laser or ArF excimer laser, are used.

Even when exposure is carried out using the short wavelength light, the attainable minimum line width is about 90 nm. On the other hand, there is an increasing demand for an increase in resolution of the pattern, and, in the future, it is not hard to anticipate that a pattern having a higher level of fineness is required. What is most important to form a pattern having a higher level of fineness than 90 nm is to develop an exposure system and a resist compatible with the exposure system. Points which are generally important for the development of the exposure system are, for example, the use of shorter wavelength as the light source wavelength, for example, $F_2$ excimer laser, EUV (extreme ultraviolet light), electron beams, X rays, and soft X rays, and an increase in numerical aperture (NA) of lenses. However, the adoption of a shorter wavelength as the light source wavelength requires an expensive new exposure system, and increasing the numerical aperture involves a problem that, the resolution and the focal depth width are in a trade-off relationship. Accordingly, even when the resolution is enhance, the focal depth width is disadvantageously lowered.

In recent years, a liquid immersion exposure method (liquid immersion lithography) has been proposed as a lithography technique which can solve the above problem. In this method, a liquid refractive index medium (a refractive index liquid, an immersion liquid) such as pure water or a fluorine-type inert liquid is interposed in a predetermined thickness in a part between a lens and a resist film on a substrate in the step of exposure, at least on the resist film. In this method, by virtue of the replacement of an exposure light path space which has hitherto been filled with an inert gas such as air or nitrogen, with a liquid having a larger refractive index (n), for example, pure water, even when a light source having the same exposure wavelength as in the case of the inert gas is used, as with the case where a shorter wavelength light source or a higher NA lens is used, a high resolution can be realized and, at the same time, the focal depth width is not reduced. The liquid immersion exposure has drawn attractive attention because, the use of the liquid immersion exposure can realize the formation of a resist pattern at a lower cost with a higher level of resolution and a better focal depth using a lens mounted on the existing apparatus. Even the liquid immersion exposure cannot realize a higher resolution pattern than the resolution limit 40 nm. Under such circumstances, various proposals have been made for realizing a higher resolution pattern.

Non-patent document 1 discloses fining of a pattern by two times exposure. In this method, a resist pattern is formed on a hard mask as a first layer by a photoresist process. Thereafter, the resist pattern is transferred onto the hard mask as the first layer by etching, and the resist is then removed. A resist pattern is then formed by a second photoresist process. The hard mask as the first layer after above transfer is again used, and the pattern is transferred by etching to the hard mask as the lowermost layer. The above two-times exposure method can realize the transfer of a superfine pattern. In this method, however, since the photoresist process is repeated twice, the time necessary for the process is increased. Accordingly, the photoresist process is disadvantageous from the viewpoint of cost. Further, the exposure involved in the photoresist process is repeated twice, two types of reticles are necessary. This requires highly accurate registration of a transferred image obtained by the transfer of a first reticle image with a transferred image obtained by the transfer of a second reticle image, and, thus, there is room for an improvement in simplicity and mass productivity.

Non-patent document 2 discloses a method for forming a superfine pattern in which a spacer is formed by a chemical vapor deposition method (hereinafter referred as "CVD") on the side wall of a patterned template formed on a film to be treated, and is used as a mask for conducting etching. This method is carried out according to the following procedure. A resist pattern is formed by a photoresist process on a previously formed template layer. An image is transferred on the template layer using the resist pattern as a mask to form convexes (a patterned template layer). Further, a spacer is formed on the side wall of the convexes by CVD. Thereafter, the convexes are removed to allow the spacer to stay as a pattern. In this case, when the patterned template layer is in a line form, two patterns of the spacer are formed for each original one line. Specifically, the pattern can be doubled. The film to be treated is treated using the doubled pattern as an etching mask to form a superfine pattern. In this non-patent document 2, a 22 nm-superfine pattern can be successfully formed by this method. In the CVD method for realizing this method, a considerably lot of time is required for the process, and, thus, the method should be significantly improved for improved mass productivity.

[Non-patent document 1] M. Dusa, et al., "Pitch doubling through dual patterning lithography challenges in integration and Lithography budgets", Proc. SPIE Vol 6520, 65200G, (2007)

[Non-patent document 2] Chris Bencher, Nanochip technology journal, issue of two 2007

DISCLOSURE OF INVENTION

Problem to be Solved by the Invention

An object of the present invention is to provide a method for forming a superfine pattern in a short time with high mass productivity, and a method for forming a superfine-patterned mask for use in realizing the method for pattern formation.

Means for Solving Problem

According to the present invention, there is provided a method for forming a superfine-patterned mask, comprising the steps of:
preparing a base substrate on which a film to be treated is layered;
forming, on the film to be treated, a first convex pattern having a convex;
coating the first convex pattern with a resin composition comprising a resin comprising repeating units each having a silazane bond;
heating the base substrate which has been subjected to the coating step, to cure the resin composition present in an area adjacent to the convex;
rinsing the base substrate which has been subjected to the curing step, to remove an uncured resin composition;
removing part of a cured resin composition on the upper surface of the convex, to form on the side wall of the convex a layer of a material different from the material of the first convex pattern; and
removing the convex, to form a superfine second convex patterned mask of the different material.

According to the present invention, there is also provided another method for forming a superfine-patterned mask, comprising the steps of:
preparing a base substrate on which a film to be treated and an intermediate film for treatment assistance are layered in order;
forming, on the intermediate film for treatment assistance, a first convex pattern having a convex;
coating the first convex pattern with a resin composition comprising a resin comprising repeating units each having a silazane bond;
heating the base substrate which has been subjected to the coating step, to cure the resin composition present in an area adjacent to the convex;
rinsing the base substrate which has been subjected to the curing step, to remove an uncured resin composition;
removing part of a cured resin composition on the upper surface of the convex, to form on the side wall of the convex a layer of a material different from the material of the first convex pattern;
removing the first convex pattern, to form a superfine second convex patterned mask of the different material; and
etching the intermediate film for treatment assistance through the second convex patterned mask, to form a superfine-patterned mask for fabricating the film to be treated.

According to the present invention, there is further provided still another method for forming a superfine-patterned mask, comprising the steps of:
preparing a base substrate on which a film to be treated is layered;
forming, on the film to be treated, a first convex pattern having a convex;
coating the first convex pattern with a resin composition comprising a resin comprising repeating units each having a silazane linkage;
heating the base substrate which has been subjected to the coating step, to cure the resin composition present in an area adjacent to the convex;
rinsing the base substrate which has been subjected to the curing step, to remove an uncured resin composition;
removing part of a cured resin composition on the upper surface of the convex, to form on the side wall of the convex a layer of a material different from the material of the first convex pattern;
embedding spaces with the material substantially same as the material of the first convex pattern, to form a pattern complementary to the first convex pattern; and
removing the layer of the different material, to form a superfine-patterned mask consisting of the first convex pattern and the complementary pattern.

According to the present invention, there is still further provided yet another method for forming a superfine-patterned mask, comprising the steps of:
preparing a base substrate on which a film to be treated and an intermediate film for treatment assistance are layered in order;
forming, on the intermediate film for treatment assistance, a first convex pattern having a convex;
coating the first convex pattern with a resin composition comprising a resin comprising repeating units each having a silazane bond;
heating the base substrate which has been subjected to the coating step, to cure the resin composition present in an area adjacent to the convex;
rinsing the base substrate which has been subjected to the curing step, to remove an uncured resin composition;
removing part of a cured resin composition on the upper surface of the convex, to form on the side wall of the convex a layer of a material different from the material of the first convex pattern;
embedding spaces between said convexes with the material substantially same as the material of the first convex pattern, to form a pattern complementary to the first convex pattern;
removing the layer of the different material, to form a superfine-patterned mask consisting of the first convex pattern and the complementary pattern; and
etching the intermediate film for treatment assistance through the first convex pattern and the complementary pattern, to form a superfine-patterned mask for fabricating the film to be treated.

According to the present invention, there is yet further provided a superfine-patterned mask formed by any one of the above methods.

According to the present invention, there is still yet further provided a method for forming a superfine pattern, comprising the step in which the film to be treated is etched by use of the above superfine-patterned mask as an etching mask.

Effect of the Invention

The present invention provides a method for forming a superfine pattern with high mass productivity, and a superfine-patterned mask usable for the method. According to this method, superfine-size patterns of which the number is twice the number of patterns formed by the conventional method can be formed. Further, there is no need to provide a complicated procedure which is necessary in the conventional method, for example, superimposition of a reticle pattern by two-times exposure, and a superfine pattern can be simply formed.

Figure 1:
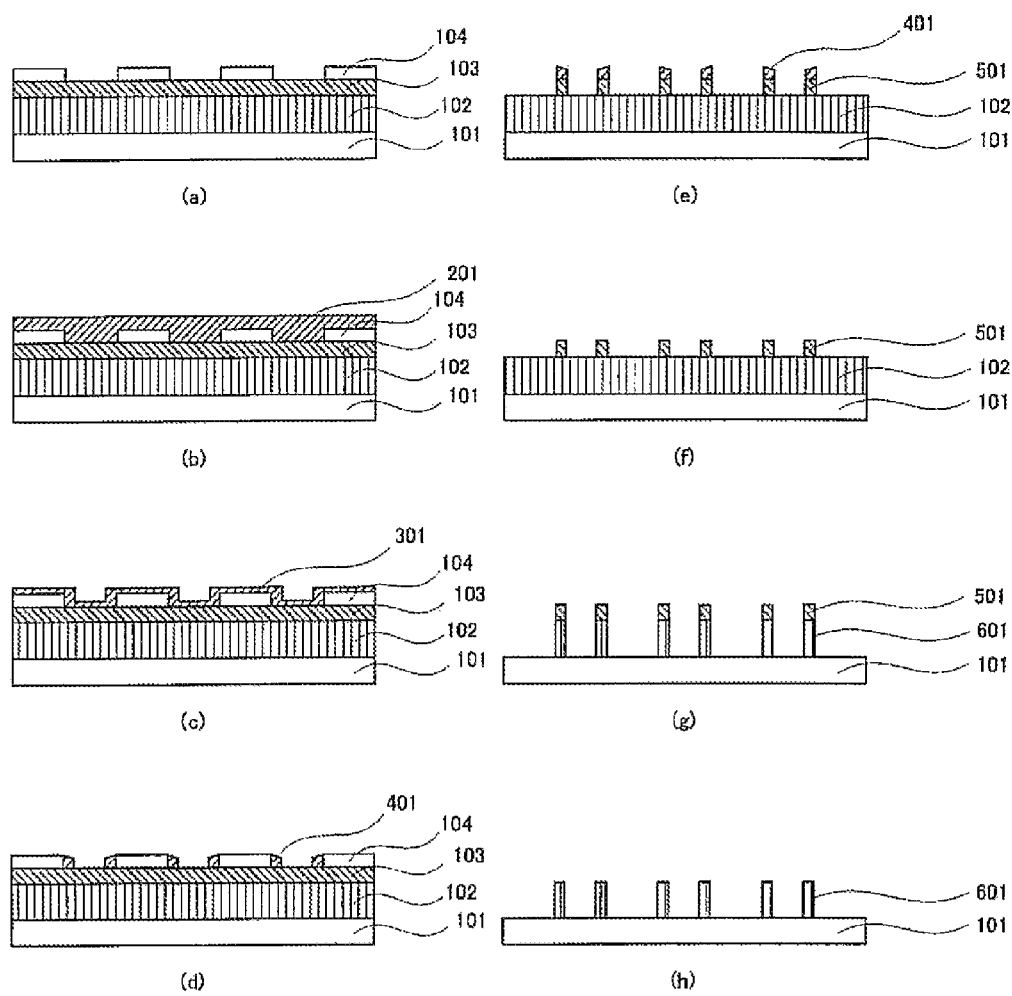
FIG. 1 is a typical diagram illustrating a first embodiment of the method for forming a superfine pattern according to the present invention.

DESCRIPTION OF REFERENCE CHARACTERS 101 base substrate
102 film to be treated
103 intermediate film for treatment assistance
104 first convex pattern
104A embedding material
201 covering layer
301 cured layer
401 spacer
501 pattern derived from the intermediate film for treatment assistance
601 superfine pattern

BEST MODE FOR CARRYING OUT THE INVENTION

First Method for Forming Superfine Pattern

The first embodiment of the present invention will be described with reference to FIGS. 1(a) to (h). FIGS. 1(a) to (h) are cross-sectional views of respective patterns in a direction perpendicular to the longitudinal direction.

A film 102 to be treated into a resultant pattern is first formed on a base substrate 101, for example, a silicon substrate or a glass substrate. In this case, an intermediate film for pre-treatment (not shown) may be previously provided on a surface of the base substrate to improve the adhesion of the film 102 to be treated, to improve the planarity of the substrate, and to improve the processability in etching treatment and the like. The film 102 to be treated may be thus formed on the base substrate 101 through the intermediate film for pre-treatment. If made of some particular substances, the base substrate can function not only as a support but also as the film to be treated. This means that the surface of the base substrate can serve as the film to be treated and hence can be fabricated by use of a patterned mask described later.

In the present invention, the film 102 to be treated into a resultant pattern may be formed of any material according to the contemplated purpose without particular limitation. Examples of materials for the film to be treated include (a) electroconductive materials, for example, aluminum (Al), aluminum silicide (AlSi), copper (Cu), tungsten (W), tungsten silicide (WSi), titanium (Ti), or titanium nitride (TiN), (b) semiconductor materials, for example, germanium (Ge) or silicon (Si), or (c) insulating materials, for example, silicon oxide (SiO), silicon nitride (SiN), silicon oxide nitride (SiON), or organic materials such as organic resins.

These materials are selected depending upon the contemplated pattern. Specifically, the film to be treated is directly fabricated into the pattern incorporated, for example, in final semiconductor devices. For example, the film is fabricated into a metal wiring layer or an interlayer insulating film, and accordingly a material suitable for its function is selected. For example, when the pattern is utilized, for example, as a trench isolation structure or a low dielectric insulating film, an inorganic or organic insulating material is used. On the other hand, when a wiring structure is formed, an electroconductive material is used. Organic materials usable herein include, for example, novolak, polyvinyl phenol, polymethacrylate, polyarylene, polyimide, and polyarylene ether materials and organic materials containing carbon atoms such as carbon.

If necessary, an intermediate film 103 for treatment assistance is formed on the film 102 to be treated. The following mainly explains the case where the intermediate film for treatment assistance is formed. As for the case where the intermediate film is not formed, the description of the intermediate film in the following can be applied to the film to be treated. That is because the present invention is characterized by forming a superfine-patterned mask directly on the film to be treated or, if formed, on the intermediate film, and therefore it essentially gives no difference to the formation of the mask itself whether the film to be treated or the intermediate film is fabricated by use of the mask.

If formed, the intermediate film for treatment assistance may be the same as or different from the aforementioned intermediate film for pre-treatment, which may be provided on the base substrate 101. The intermediate film for treatment assistance may be made of materials for conventional anti-reflection layers, so as to function as an anti-reflection layer. Further, the intermediate film for treatment assistance may serve as the lower resist layer in a multilayer resist method. In that case, the intermediate film is made of, for example, novolak, polyvinyl phenol, polyarylene, polyimide, polymethacrylate, polyarylene ether materials, and organic materials containing carbon atoms such as carbon.

When an organic material is used as the material for the intermediate film for treatment assistance, the content of carbon in the organic material is preferably not less than 10% by weight. The reason for this is that, when the carbon content is not less than 10% by weight, in the etching process, the etching selection ratio between the film and a layer formed of a resin composition which will be described later, in other words, the etching rate difference, is increased, contributing to easy processing. The thickness of the intermediate film for treatment assistance varies depending upon applications and preferably generally falls within the range of 20 to 10000 nm. The reason for this is that, when the thickness of the film is not more than 20 nm, a contemplated final pattern derived from the intermediate film for treatment assistance cannot be sometimes provided. When the thickness of the film is not less than 10000 nm, the occurrence of the processing conversion difference is significant in the process of transferring a spacer pattern, which will be described later, onto the film to be treated.

Further, according to the kinds of the film to be treated and the intermediate film for treatment assistance and also to the etching conditions, it is possible to stack a plural number of the intermediate films for treatment assistance. Particularly when formed on the film 102 to be treated, the intermediate film 103 for treatment assistance is preferably made of such material that the intermediate film can be etched through a mask, which is a spacer part formed from the later-described resin composition, and then that the thus-etched film can play the role of a mask when the underlying film to be treated is etched in the subsequent procedure. In this case, the mask of the etched film is itself regarded as a superfine-patterned mask. The film to be treated is not necessarily formed on the base substrate, and the intermediate film 103 for treatment assistance may be directly formed on the surface of the base substrate and fabricated to be a superfine-patterned mask that is used for fabricating the base substrate surface serving as the film to be treated.

A first convex pattern 104 having convexes is formed on the film 102 to be treated either through an intermediate film 103 for treatment assistance when the intermediate film 103 is present, or directly on the film 102 when the intermediate film 103 is absent (FIG. 1(a)). Specifically, the resist pattern 104 can be formed by coating a resist (for example, a positive-working chemical amplification resist) composition or the like and exposing and developing the coating by a conventional method. However, this by no means restricts the process of forming the convex pattern 104, which can be formed in other manners. For example, a layer is prepared from materials other than the resist composition, and is then fabricated by lithography or the like to form the convex pattern 104.

A radiation-sensitive resin composition usable for the formation of the resist pattern 104 may be any conventional radiation-sensitive resin composition. Radiation-sensitive resin compositions include, for example, positive-working resists containing alkali soluble resins such as novolak resins, hydroxystyrene resins, or acrylic resins, and quinonediazide compounds, and chemical amplification-type positive or negative working resists which, upon light irradiation, generate an acid of which the catalytic action is utilized to form a resist pattern. Preferred are chemical amplification-type positive working resists which, upon light irradiation, generate an acid of which the catalytic action is utilized to form a resist pattern. A number of resist materials have been proposed and are commercially available, and any conventional resist material may be used. The resist pattern may be formed using a radiation-sensitive resin composition by any conventional method, for example, a coating method, an exposure method, a baking method, a development method, a developing agent, or a rinsing method.

In order to form a final superfine pattern, preferably, the fineness of the first convex pattern is higher. To this end, for example, a method for forming a superfine pattern using ArF or KrF as an exposure light source is preferably adopted.

The thickness of the first convex pattern corresponds to the thickness of a spacer part which will be described later. For example, when the thickness of the intermediate film 103 for treatment assistance is in the range of 20 to 10000 nm, the thickness of a spacer part 401 which will be described later is preferably in the range of 20 to 5000 nm. Accordingly, the thickness of the first convex pattern should be similar thereto. The reason for this is that, when the thickness of the spacer part 401 is smaller than 20 nm, in the process of etching the intermediate film 103 for treatment assistance, the spacer part 401 as the mask is disadvantageously consumed and the processing of the intermediate film 103 for treatment assistance into predetermined dimension and shape is difficult. On the other hand, when the thickness of the first convex pattern 104 is reduced, the exposure allowance in the exposure, focus allowance, or resolution can be improved. When the thickness of the spacer part 401 is larger than 5000 nm, caution is required, because the resolution of the resist pattern as the first convex pattern per se is difficult and embedding of the resin composition per se is difficult.

Next, as shown in FIG. 1(b), the resin composition is coated so as to cover the first convex pattern 104 to form a covering layer 201.

The resin composition used herein comprises a resin comprising repeating units having a silazane bond. The silazane bond refers to Si—N linkage and has bonding hands for bonding to other units, and the other bonding hands are substituted by an arbitrary substituent. In general, the substituent is hydrogen or a hydrocarbon group and may be substituted by a silicon-containing group or a functional group such as a hydroxyl group, a carboxyl group, or an amino group. The number of bonding hands in the repeating unit is 2 or more. When 3 or more bonding hands are present, the resin can take a two- or three-dimensional structure.

The repeating unit having the silazane bond may be selected from arbitrary linkages. Preferred are, for example, those represented by formula (I).

[Chemical formula 1]

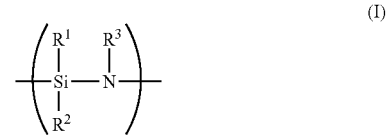

wherein $R^1$ and $R^2$ are independently a hydrogen atom, alkyl, alkenyl, cycloalkyl, aryl, alkylsilyl, alkylamino, alkoxyl, or a group, other than these groups, wherein the atom to be bound to the silicon atom is a carbon atom; and $R^3$ is a hydrogen atom, alkyl, alkenyl, cycloalkyl, aryl, alkylsilyl, alkylamino, alkoxyl, or a silazane group having a saturated hydrocarbon group containing from 1 to 6 carbon atoms, at least one of $R^1$, $R^2$ and $R^3$ being a hydrogen atom.

The resin represented by formula (I) is generally called a "polysilazane." When any of $R^1$ to $R^3$ is a silazane group represented by formula (I), the polysilazane can take a two- or three-dimensional structure. Further, a combination of two or more types of repeating units represented by formula (I) may also be adopted.

Among these resins, one type of preferred resins includes perhydropolysilazanes consisting of silicon, nitrogen, and hydrogen. One of such perhydropolysilazanes is a compound represented by formula (I) wherein all of $R^1$ to $R^3$ are hydrogen atoms. Other perhydropolysilazanes comprise —(SiH$_2$NH)— and —(SiH$_2$N)< as repeating units, and the end is hydrogen or —SiH$_3$. The perhydropolysilazane can take various structures by varying the mixing ratio of repeating units. For example, the following structure may be exemplified.

[Chemical formula 2]

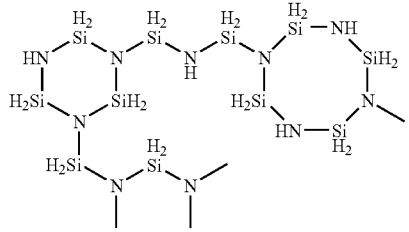

Further, regarding the repeating unit, for example, repeating units comprising other hydrocarbons and repeating units comprising siloxane linkages can be combined so far as the effect of the present invention is not sacrificed.

The molecular weight of the resin may be arbitrarily selected depending, for example, upon the type of the resist applied and the type of the contemplated pattern. Preferably, however, the molecular weight of the resin is 500 to 100000, more preferably 600 to 10000, in terms of the weight average molecular weight.

The resin composition used in the present invention generally comprises a solvent. The solvent should dissolve the resin. This is because, when the composition is coated on the first convex pattern, the composition is preferably homogeneous. Accordingly, the solubility of the resin in the solvent may be such that the composition can be rendered homogeneous. On the other hand, when the convex pattern is an organic resist pattern, upon coating of the resin composition on the convex pattern, the dissolution of the pattern in the solvent disadvantageously breaks the pattern before the fining of the pattern. Accordingly, the solvent should not dissolve the resist pattern. Further, preferably, the solvent is not reacted with the resin.

The solvent used in the present invention may be any solvent so far as the solvent satisfies the above requirement. Further, the solvent may be selected depending, for example, upon the type of resin used and resist material applied. Such solvents include (a) ethers, for example, dibutyl ether (DBE), dipropyl ether, diethyl ether, methyl-t-butyl ether (MTBE), and anisole, (b) saturated hydrocarbons, for example, decalin, n-pentane, 1-pentane, n-hexane, i-hexane, n-heptane, i-heptane, n-octane, i-octane, n-nonane, i-nonane, n-decane, i-decane, ethylcyclohexane, methylcyclohexane, cyclohexane, and p-menthane, (c) unsaturated hydrocarbons, for example, cyclohexene, and dipentene (limonene), (d) ketones, for example, methy isobutyl ketone (MIBK), and (e) aromatic hydrocarbons, for example, benzene, toluene, xylene, ethyl benzene, diethyl benzene, trimethyl benzene, and triethyl benzene. Among them, solvents selected from the group consisting of (a) ethers and (b) saturated hydrocarbons are preferred. More specifically, when the first convex pattern is an organic photoresist, dibutyl ether and decaline are preferred solvents, because, even when the type of the resin and resist material varies, they can be extensively applied. These solvents may if necessary be used in a combination of two or more of them.

The resin composition according to the present invention comprises the above resin dissolved in the above solvent. The concentration of the resin is not particularly limited. The resin concentration may be properly regulated depending upon the coatability of the resin composition, for example, onto the surface of the first convex pattern and the thickness of the desired pattern covered and cured layer. In general, the resin content is preferably 0.01 to 30%, more preferably 0.3 to 20%, based on the total weight of the composition.

The resin composition according to the present invention may if necessary comprise other additives. Such additives include surface active agents, leveling agents, and plasticizers.

The resin composition may be coated for forming the covering layer 201, for example, by conventional methods used in coating the radiation-sensitive resin composition, and examples of suitable methods include spin coating, spray coating, dip coating, and roller coating. The coated covering layer is subsequently heated to cure the resin composition present near the first convex pattern.

The resin composition layer is heated, for example, under conditions of a temperature of 60 to 250° C., preferably 80 to 170° C., and a heating time of 10 to 300 sec, preferably about 60 to 120 sec. The temperature is preferably a temperature at which intermixing of the resist pattern with the resin composition layer takes place. The thickness of the resin composition layer formed may be properly regulated, for example, by the temperature and time of the heat treatment, the radiation-sensitive resin composition used, and the water-soluble resin composition. Accordingly, these various conditions may be determined based on the necessary level of fineness of the resist pattern, in other words, a necessary increase in width of the resist pattern. The thickness of the covering layer, however, is generally 0.01 to 100 μm in terms of thickness as determined from the surface of the resist pattern.

Thus, upon heating of the whole substrate, a curing reaction of the covering layer 201 takes place near convexes of the first convex pattern. Thereafter, a pattern provided by fining the first convex pattern covered with the cured layer 301 can be provided by rinsing the substrate with a solvent to remove the uncured resin composition (FIG. 1(c)).

A solvent, which cannot significantly dissolve the cured layer and can significantly dissolve the resin composition, is selected as the solvent for the rinsing treatment which, upon heating, can allow only the formed cured layer 301 to stay and can remove the resin composition in its part remaining unreacted. The solvent used in the resin composition is more preferably used in the rinsing treatment.

Next, the cured layer formed on the first convex pattern is processed to form a layer, formed of a material dissimilar to the material constituting the first convex pattern, on the side wall of the convexes of the first convex pattern. This layer is hereinafter referred to as "spacer" for convenience. In order to form this spacer, the cured layer covering the upper surface of the first convex pattern should be selectively removed. In this case, the selective etching method is not particularly limited so far as the spacer can be finally formed. Examples of selective etching methods include wet etching methods after protecting the side wall part of the cured layer with any embedding agent, or dry etching methods, for example, reactive ion etching, magnetron-type reactive ion etching, electron beam ion etching, ICP etching, or ECR ion etching. As described above, the cured layer forms a compound with other element wherein silicon is a central element. Accordingly, when the dry etching method is used, the use of a source gas containing a fluorine atom (F) is preferred.

The embedded bottom where neither the convex pattern nor the spacer is formed, that is, the surface of the intermediate film 103 for treatment assistance if provided or of the film 102 to be treated if the intermediate film is not provided, may be also covered with the cured layer. If the method of coating the resin composition and/or the curing condition is properly controlled, it is possible not to form the cured layer on the embedded bottom. However, the cured layer is normally formed on the embedded bottom. In this case, that must be removed. It is easy and preferred that the cured layer both on the embedded bottom and on the upper surface of the convex pattern be removed at the same time. The etching condition is so controlled as to simultaneously remove the cured layer both on the embedded bottom and on the upper surface of the convex pattern. However, the cured layer on the embedded bottom may be removed in any step before the film to be treated is etched through the superfine-patterned mask. Specifically, it may be carried out before the cured layer on the upper surface of the convex pattern is removed or otherwise simultaneously with the later-described removal of the first convex pattern. Nevertheless, if the intermediate film 103 for treatment assistance is provided, it is necessary to remove the cured layer before the intermediate film is etched.

The above processing forms a layer (spacer) 401 formed of a material dissimilar to the material constituting the first convex pattern on the side wall of the convexes of the first convex pattern and thus to form a second convex pattern (FIG. 1(d)).

Next, the first convex pattern 104 is removed to form a mask layer composed of only the spacer 401 by a dry etching method (not shown), and then the intermediate layer 103 for treatment assistance (or the film to be treated, if the intermediate layer is not provided) in its part not covered by the spacer 401 is removed by etching. That is, the intermediate film 103 for treatment assistance is etched using the second convex pattern composed of the spacer 401 as a mask to form a pattern 501 derived from the intermediate film for treatment assistance (FIG. 1(e)). Here, the removal of the first convex pattern and that of the intermediate layer 103 for treatment assistance or of the film to be treated can be independently carried out while the etching condition is controlled, or otherwise may be performed successively or simultaneously under the same etching condition. If the etching condition is so controlled that only the first convex pattern is removed to complete the treatment, a mask layer composed of only the spacer 401 can be obtained. When the initially formed first convex pattern 104 is a line-and-space pattern, in the pattern 501, a spacer is formed as a line pattern on both sides of each line. Accordingly, when the number of line patterns is taken into consideration, patterns of which the number is twice the number of patterns formed by the conventional method. Therefore, this method can also be called a pattern doubling method.

Prior to etching for forming the pattern 501, for example, a resin is preferably embedded in a space part between the first convex patterns. Specifically, in the etching treatment, a part of the side of the second convex pattern is exposed, and hence the width is sometimes reduced by etching effect. Accordingly, the second convex pattern is preferably protected by resin embedding. The resin may be arbitrarily selected from various resins but is preferably an organic material having an etching selection ratio equal to that of the first convex pattern. Examples of such organic materials include solutions of polyvinylpyrrolidone-hydroxyethyl acrylate or the like dissolved in solvents.

In this case, the dry etching method is not particularly limited so far as the intermediate film 103 for treatment assistance can be processed. The method can be properly selected from known processes capable of micro-fabrication. Examples of the processes include reactive ion etching, magnetron-type reactive ion etching, electron beam ion etching, ICP etching, or ECR ion etching. A gas containing at least any one atom selected from the group consisting of an oxygen atom (O), a nitrogen atom (N), a chlorine atom (Cl), and a bromine atom (Br) is preferably used as the source gas. A compound containing a bond between an inorganic element and oxygen is inert to an enchant provided by discharge using the above atom-containing gas and thus advantageously acts on the spacer part.

Accordingly, the intermediate film 103 for treatment assistance can be etched with good anisotropy. Oxygen atom-containing etching gases include $O_2$, CO, and $CO_2$. Nitrogen atom-containing etching gases include $N_2$ and $NH_3$. Chlorine atom-containing etching gases include $Cl_2$, HCl and $BCl_3$. Bromine atom-containing etching gases include HBr and $Br_2$. These etching gases may be used as a mixture of two or more. Further, the etching gas may contain a sulfur atom (S). The reason for this is that the film to be treated can be processed with good anisotropy. In addition to the above gas, gases such as argon (Ar) or helium (He) may be contained.

After the formation of the pattern 501, the spacer 401 which stays on the pattern 501 is if necessary removed (FIG. 1(f)). Thus, a superfine pattern usable as a mask for film 102 processing is formed. If the intermediate film 103 for treatment assistance is not provided, the film to be treated is processed to form a superfine pattern. In this case, for example, wet etching methods or dry etching methods, for example, reactive ion etching, magnetron-type reactive ion etching, electron beam ion etching, ICP etching, or ECR ion etching may be used. As described above, in the cured layer, silicon constitutes a central atom and forms a compound with other elements. Accordingly, when the dry etching method is used, the use of a source gas containing a fluorine atom (F) is preferred. Since, however, the film 102 to be treated is exposed in a space, a method which does not damage the film to be treated should be selected from the above group of methods.

The film 102 is then treated using this pattern 501 as an etching mask. A wet etching method or a dry etching method may be used for treating the film. More specific examples of such methods include dry etching methods, for example, reactive ion etching, magnetron-type reactive ion etching, electron beam ion etching, ICP etching, or ECR ion etching. In general, an etchant is selected depending upon the material for the film to be treated.

A superfine pattern 601 formed of the film to be treated is formed by processing the film to be treated (FIG. 1(g)), and, if necessary, the pattern 501 which stays as the mask is removed.

The method comprising providing a base substrate comprising a film to be treated and an intermediate film for treatment assistance provided on a substrate, providing a superfine-patterned mask formed directly thereon, and forming a superfine pattern has been described above. The present invention, however, is not limited to this method only. Alternative methods usable herein include a method comprising forming an intermediate film 103 for treatment assistance on a transparent substrate such as a bare glass substrate to form a base substrate and treating the base substrate by the method according to the present invention to form an independent superfine-patterned mask, bringing the superfine-patterned mask into intimate contact with a resist film provided on a separately provided insulating material film or an electroconductive material film, and exposing the assembly to light, that is, subjecting the assembly to contact exposure to form a pattern, or a method comprising transferring a superfine-patterned mask formed according to the above method on the base substrate onto a separately provided insulating material film or an electroconductive material film, and subjecting the assembly to etching through the patterned mask to form a pattern. The pattern formed according to the present invention may be used as a pattern mask for use in a next step.

Second Method for Forming Superfine Pattern

In the first method for forming a superfine pattern, the pattern is formed using the spacer formed on the side wall of the convexes of the first convex pattern as a mask. On the other hand, in the second method for forming a superfine pattern, the pattern is formed by removing the spacer and the layer underlying the spacer. The second embodiment of the present invention will be described in detail with reference to FIGS. 2(a) to (h).

At the outset, as with the first method for forming a superfine pattern, a spacer is formed on the side wall of the convexes of the first convex pattern (FIGS. 2(a) to (d)). Steps up to this stage are the same as those in the first method for forming a superfine pattern.

Figure 2:
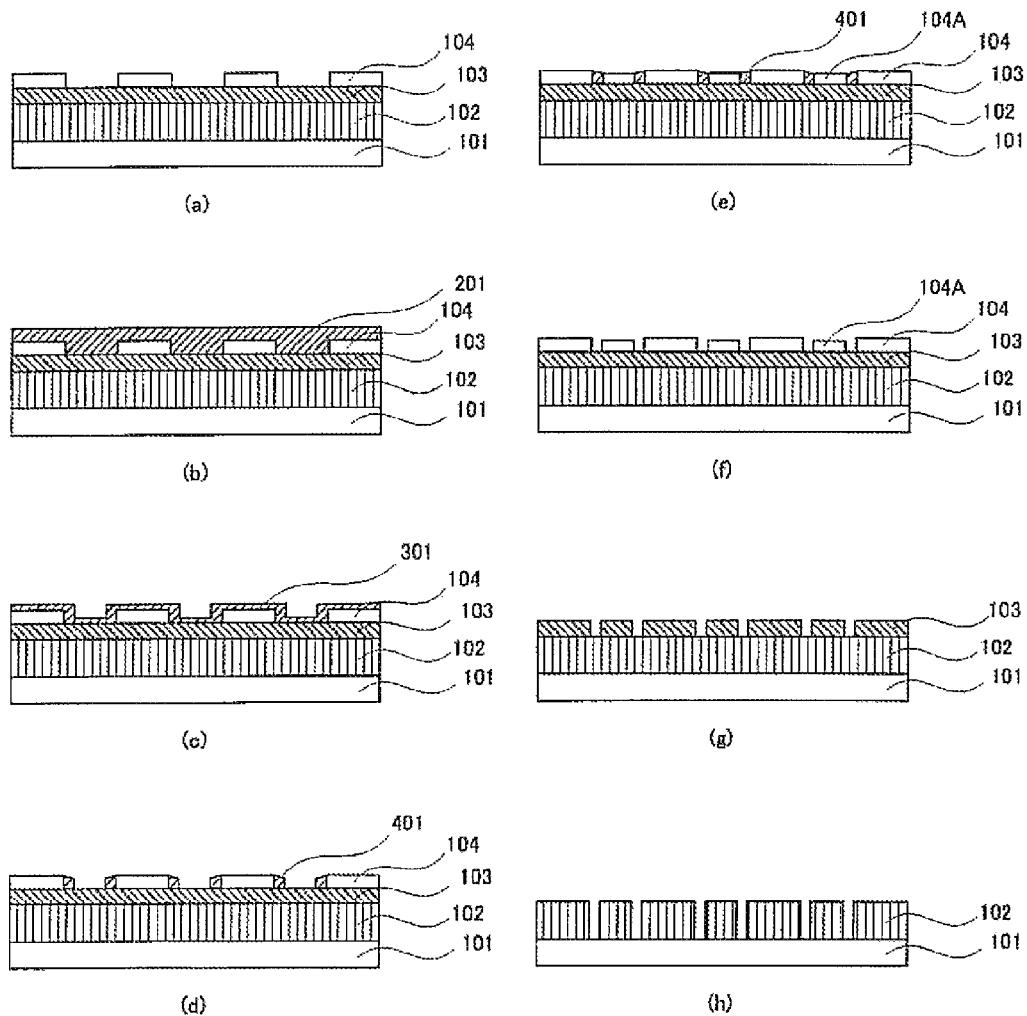
FIG. 2 is a typical diagram illustrating a second embodiment of the method for forming a superfine pattern according to the present invention.

A material 104A which is equivalent to the first convex pattern is embedded in the space part between the first convex patterns (FIG. 2(e)). The space part between the first convex patterns has been fined by the spacer 401, and consequently the space between the spacers substantially constitutes the space part.

Preferably, the material equivalent to the material for the first convex pattern embedded in the space part between the first convex patterns is the same as the material used in the formation of the first pattern. For example, when the first convex pattern has been formed using a resist resin or the like, preferably, the resist composition used for the formation of the first convex pattern is filled into the space part followed by curing. In this connection, it should be noted that the material embedded in the space part constitutes a pattern complementary to the first convex pattern later. In other words, the material embedded in the space part forms additional convexes complementing the first convex pattern. Specifically, in forming a final superfine pattern, the material should function as the same mask material as in the first convex pattern. Accordingly, the material equivalent to the material constituting the first convex pattern is not necessarily identical to the material used in the formation of the first convex pattern, and may be any material which functions as the mask material as in the first convex pattern and further which can be etched and removed as in the first convex pattern.

In order to allow the martial layer embedded in the space part to function as the mask material for forming a final superfine pattern, preferably, the thickness of the material layer is the same as the thickness of the first convex pattern. To this end, the material layer is preferably embedded to a height which is the same as the height of the first convex pattern. Alternatively, a method may also be adopted in which, after the material layer is embedded to a larger height than the height of the first convex pattern, the assembly is then flattened, for example, by etching treatment to the same height as the first convex pattern. In FIG. 2(e), the height of the embedded material 104A is described as different from the height of the first convex pattern 104 for distinguishing the embedded material 104A from the first convex pattern 104. Preferably, however, the height difference is small.

Subsequently, the spacer 401 is removed by the same method as described above in connection with the first method for forming a superfine pattern (FIG. 2(f)). Thus, a mask for etching the film 102 to be treated or the intermediate film 103 for treatment assistance is formed. This mask comprises a first convex pattern 104 and a pattern 104A complementary to the first convex pattern 104.

The intermediate film 103 for treatment assistance is treated using a mask formed of the first convex pattern 104 and the pattern 104A complementary to the first convex pattern 104 (FIG. 2(g)) to form a superfine-patterned mask for treating the film 102 to be treated. The film 102 to be treated is treated using the patterned intermediate layer 103 for treatment assistance as a mask (FIG. 2(h)). Thus, a superfine pattern having grooves corresponding to the spacer 401 can be formed.

As described above, in the method for forming a superfine pattern according to the present invention, the provision of the steps specified in the present invention is indispensable. Further, these steps may be combined with conventional methods. Accordingly, when a resist pattern is used in the first convex pattern, the photoresist used in the formation of the resist pattern and the resist forming method using the resist pattern may be any of the conventional photoresists and the conventional resist forming methods. The resist pattern may be any commonly used resist pattern. On the other hand, regarding the first convex pattern, a convex pattern formed by using a photoresist after the formation of the above superfine pattern as an etching mask for etching the underlying layer is usable.

EXAMPLES

The following various Examples further illustrate the present invention.

Example 1

AZ KrF-17B manufactured by AZ Electronic Materials (Japan) K.K. (hereinafter, referred to as "AZ-EM K.K.") was coated onto a silicon substrate, and the coated silicon substrate was heated at 180° C. for 60 sec to form a bottom antireflection film. As described later, the bottom antireflection film also served as a carbon hard mask effectively when a $SiO_2$ film was etched. The thickness of the film was 60 nm. An ArF photoresist AZ AX1120 manufactured by AZ-EM K.K. was then coated by a spin coater (ACT12 (tradename)) manufactured by Tokyo Electron Limited, and the coating was heated at 120° C. for 90 sec. In this case, regulation was carried out to form a 210 nm-thick resist film. Image-wise exposure was carried out with an exposure system (5306D manufactured by NIKON CORPORATION) having an exposure wavelength of an ArF radiation (193 nm) followed by post-exposure baking (hereinafter referred to as PEB) by a hot plate at 120° C. for 90 sec. The film was then subjected to spray paddle development with an alkaline developing solution (AZ 300MIF developer, 2.38 wt % aqueous tetramethylammonium hydroxide solution) manufactured by AZ-EM K.K. at 23° C. for one min to form a line-and-space pattern (a first convex pattern) with a line width of 170 nm and a pitch of 340 nm.

A polysilazane (comprising repeating units represented by general formula (I)) manufactured by AZ-EM K.K. was dissolved in dibutyl ether to a polymer concentration of about 10%. The solution was filtered through a 0.05-μm filter to give a resin composition. The resin composition was then coated onto the substrate with the line-and-space pattern printed thereon, and the coated substrate was heated at 90° C. for 60 sec. The coating in this case was carried out under such conditions that an about 120 nm-thick coating is formed by spin coating on a bare silicon substrate. Thereafter, the substrate was then rinsed with dibutyl ether, which is the same solvent as used in the resin composition, to remove an uncured part in the resin film to form a cured layer.

The width of the line pattern thus obtained was measured and was found to be 186 nm.

Next, etching treatment was carried out with an etching apparatus. In this case, a plasma etching apparatus (NE5000 (tradename) manufactured by ULVAC, Inc.) was used as the etching apparatus. In this etching step, the cured layer in its part located on the upper part of the first convex pattern and in the lower layer part located between the convexes in the first convex pattern was removed to form a second convex pattern on the side wall of the first convex pattern. The etching was carried out with a mixed gas of $CF_4/O_2$ at a $CF_4/O_2$ flow ratio of 20/20 sccm under conditions of process pressure 5.0 Pa and antenna power 500 W. The etching time was 20 sec.

After the formation of the second convex pattern, oxygen plasma etching was again carried out with the same apparatus as used above to remove the resist part and the carbon hard mask part. The etching in this case was carried out with a mixed gas of $O_2$ (flow ratio of each component: 20 sccm) under conditions of process pressure 5.0 Pa and antenna power 500 W. The etching time was 20 sec.

The pattern after the etching was observed under a scanning electron microscope (S4700 (tradename) manufactured by Hitachi, Ltd.). As a result, the number of patterns observed was twice of the first convex patterns. The line width was 20 nm. Further, it could be confirmed that the carbon hard mask in its part other than the formed superfine pattern was removed.

Example 2

AZ KrF-17B manufactured by AZ-EM K.K. was coated onto a silicon substrate, and the coated silicon substrate was heated at 180° C. for 60 sec to form a carbon hard mask. The thickness of the carbon hard mask layer was 60 nm. An ArF photoresist AZ AX1120 manufactured by AZ-EM K.K. was then coated by a spin coater (ACT12 (tradename)) manufactured by Tokyo Electron Limited, and the coating was heated at 120° C. for 90 sec. In this case, regulation was carried out to form a 210 nm-thick resist film. Exposure was carried out with an exposure system (S306D manufactured by NIKON CORPORATION (tradename)) having an exposure wavelength of an ArF radiation (193 nm) followed by PEB by a hot plate at 120° C. for 90 sec. The film was developed in the same manner as in Example 1 to form a line-and-space pattern (a first convex pattern) with a line width of 170 nm and a pitch of 340 nm.

A resin composition is prepared in the same manner as in Example 1. The resin composition was then coated onto the substrate with the line-and-space pattern printed thereon, and the coated substrate was heated at 90° C. for 60 sec. The coating in this case was carried out under such conditions that an about 120 nm-thick coating was formed by spin coating on a bare silicon substrate. Thereafter, the substrate was then rinsed with dibutyl ether, which is the same solvent as used in the resin composition, to remove an uncured part in the resin film to form a cured layer.

The width of the line pattern thus obtained was measured and was found to be 180 nm.

Thereafter, polyvinylpyrrolidone-hydroxyethyl acrylate as an embedding material was dissolved in water to give a 10% aqueous solution. The aqueous solution was filtered through a 0.05-μm filter to give a composition. The composition was coated on the assembly so that the coating thickness was 270 nm on the flat part. Here it was confirmed that the embedding agent was overcoated to a position above the cured layer.

Next, etching treatment was carried out with an etching apparatus. In this case, a plasma etching apparatus (NE5000 (tradename) manufactured by ULVAC, Inc.) was used as the etching apparatus. In this etching step, etch back in the overcoated part of the embedding agent and the cured layer in its part located on the upper part of the first convex pattern and in the lower layer part located between the convexes in the first convex pattern were removed to form a spacer on the side wall of the first convex pattern. The etching was carried out with a mixed gas of $CF_4/O_2$ at a $CF_4/O_2$ flow ratio of 20/20 sccm under conditions of process pressure 5.0 Pa and antenna power 500 W. The etching time was 20 sec.

After the formation of the spacer, oxygen plasma etching was again carried out with the same apparatus as used above to remove the resist part and the carbon hard mask.

The etching in this case was carried out with a gas of $O_2$ (flow: 20 sccm) under conditions of process pressure 5.0 Pa and antenna power 500 W. The etching time was 20 sec.

The pattern after the etching was observed under a scanning electron microscope (S4700 (tradename) manufactured by Hitachi, Ltd.). As a result, the number of fined patterns observed was twice of the first convex patterns. The line width was 23 nm. Further, it could be confirmed that the carbon hard mask in its part other than the superfine pattern was removed. The reason why the line width is larger than that in Example 1 is considered attributable to the fact that the embedding agent could suppress the removal of the spacer by etching.

Example 3

AZ ArF-1C5D manufactured by AZ-EM K.K. was coated onto a silicon substrate, and the coated silicon substrate was heated at 180° C. for 60 sec to form a bottom antireflection film. The thickness of the film was 37 nm. An ArF photoresist AZ AX2110P manufactured by AZ-EM K.K. was then coated by a spin coater (ACT12 (tradename)) manufactured by Tokyo Electron Limited, and the coating was heated at 100° C. for 60 sec. In this case, regulation was carried out to form a 120 nm-thick resist film. Image-wise exposure was carried out with an exposure system (S306D manufactured by NIKON CORPORATION (tradename)) having an exposure wavelength of an ArF radiation (193 nm) followed by PEB by a hot plate at 110° C. for 60 sec. The film was developed in the same manner as in Example 1 to form a line-and-space pattern (a first convex pattern) with a line width of 55 nm and a pitch of 140 nm.

A resin composition was prepared in the same manner as in Example 1. The resin composition was then coated onto the substrate with the line-and-space pattern printed thereon, and the coated substrate was heated at 90° C. for 180 sec. The coating in this case was carried out under such conditions that an about 120 nm-thick coating is formed by spin coating on a bare silicon substrate. Thereafter, the substrate was then rinsed with dibutyl ether, which is the same solvent as used in the resin composition, to remove an uncured part in the resin film to form a cured layer.

The width of the line pattern thus obtained was measured and was found to be 86 nm.

Next, etching treatment was carried out with a plasma etching apparatus (NE5000 (tradename) manufactured by ULVAC, Inc.). In this etching step, the cured layer in its part located on the upper part of the first convex pattern and in the lower layer part located between the convexes in the first convex pattern was removed to form a second convex pattern on the side wall of the first convex pattern. The etching was carried out with a mixed gas of $CF_4/O_2$ (flow ratio of each component: 20/20 sccm) under conditions of process pressure 5.0 Pa and antenna power 500 W. The etching time was 20 sec. The height of the pattern was 80 nm.

Subsequently, the space part of the obtained pattern was spin-coated with the ArF photoresist AZ AX2110P to be embedded. The height of the embedded part was 80 nm, which was as high as the pattern.

The obtained embedded part was then subjected to the step for removing the second convex pattern. The step was carried out by means of the above etching apparatus in an atmosphere of $CF_4/O_2$ mixed gas (flow ratio of each component: 20/20 sccm) under conditions of process pressure 5.0 Pa and antenna power 500 W. The etching time was 15 sec.

The pattern after the etching was observed under a scanning electron microscope (S4700 (tradename) manufactured by Hitachi, Ltd.). As a result, the number of patterns observed was twice of the first convex patterns. The line width was 18 nm.

Example 4

A $SiO_2$ film of 100 nm thickness was deposited by CVD on a silicon substrate. The $SiO_2$ film functioned as the film to be treated. AZ ArF-1C5D manufactured by AZ-EM K.K. was coated onto the silicon substrate, and the coated silicon substrate was heated at 180° C. for 60 sec to form a bottom antireflection film. As described later, the bottom antireflection film also effectively served as a carbon hard mask when a $SiO_2$ film was etched. The thickness of the film was 90 nm.

An ArF photoresist AZ AX2110P manufactured by AZ-EM K.K. was then coated by a spin coater (ACT12 (tradename)) manufactured by Tokyo Electron Limited, and the coating was heated at 100° C. for 60 sec. In this case, regulation was carried out to form a 120 nm-thick resist film. Image-wise exposure was carried out with an exposure system (S306D manufactured by NIKON CORPORATION (tradename)) having an exposure wavelength of an ArF radiation (193 nm) followed by PEB by a hot plate at 110° C. for 60 sec. The film was developed in the same manner as in Example 1 to form a line-and-space pattern (a first convex pattern) with a line width of 55 nm and a pitch of 140 nm.

A resin composition was prepared in the same manner as in Example 1. The resin composition was then coated onto the substrate with the line-and-space pattern printed thereon, and the coated substrate was heated at 90° C. for 180 sec. The coating in this case was carried out under such conditions that an about 120 nm-thick coating is formed by spin coating on a bare silicon substrate. Thereafter, the substrate was then rinsed with dibutyl ether, which is the same solvent as used in the resin composition, to remove an uncured part in the resin film to form a cured layer.

The width of the line pattern thus obtained was measured and was found to be 85 nm.

Next, etching treatment was carried out with a plasma etching apparatus (NE5000 (tradename) manufactured by ULVAC, Inc.). In this etching step, the cured layer in its part located on the upper part of the first convex pattern and in the lower layer part located between the convexes in the first convex pattern was removed to form a second convex pattern on the side wall of the first convex pattern. The etching was carried out with a mixed gas of $CF_4/O_2$ (flow ratio of each component: 20/20 sccm) under conditions of process pressure 5.0 Pa and antenna power 500 W. The etching time was 20 sec. The height of the pattern was 80 nm.

Subsequently, oxygen plasma etching was again carried out with the same apparatus as used above to remove the resist part and a bottom antireflection layer. The etching in this case was carried out with a gas of $0_2$ (flow: 20 sccm) under conditions of process pressure 5.0 Pa and antenna power 500 W. The etching time was 25 sec.

The pattern after the etching was observed under a scanning electron microscope (S4700 (tradename) manufactured by Hitachi, Ltd.). As a result, the number of fined patterns observed was twice of the first convex patterns. It was verified that a silicon layer of 20 nm height and the bottom antireflection layer (height: 90 nm) which lies under the silicon layer were formed with the line width of 21 nm.

The $SiO_2$ film as the film to be treated was etched through the bottom antireflection film as a mask by means of the above etching apparatus in an atmosphere of $CF_4/O_2$ mixed gas (flow ratio of each component: 30/10 sccm) under conditions of process pressure 5.0 Pa and antenna power 500 W. The etching time was 25 sec.

The pattern after the etching was observed under a scanning electron microscope (S4700 (tradename) manufactured by Hitachi, Ltd.). As a result, a line width of a $SiO_2$ pattern observed was 19 nm.

Example 5

A $SiO_2$ film of 50 nm thickness was deposited by CVD on a silicon substrate. The $SiO_2$ film functioned as the film to be treated. AZ ArF-1C5D manufactured by AZ-EM K.K. was coated onto the silicon substrate, and the coated silicon substrate was heated at 180° C. for 60 sec to form a bottom antireflection film. The thickness of the film was 37 nm.

An ArF photoresist AZ AX2110P manufactured by AZ-EM K.K. was then coated by a spin coater (ACT12 (tradename)) manufactured by Tokyo Electron Limited, and the coating was heated at 100° C. for 60 sec. In this case, conditions were adjusted to form a 120 nm-thick resist film. Image-wise exposure was carried out with an exposure system (S306D manufactured by NIKON CORPORATION (tradename)) having an exposure wavelength of an ArF radiation (193 nm) followed by PEB by a hot plate at 110° C. for 60 sec. The film was developed in the same manner as in Example 1 to form a line-and-space pattern (a first convex pattern) with a line width of 55 nm and a pitch of 140 nm.

A resin composition was prepared in the same manner as in Example 1. The resin composition was then coated onto the substrate with the line-and-space pattern printed thereon, and the coated substrate was heated at 90° C. for 180 sec. The coating in this case was carried out under such conditions that an about 120 nm-thick coating is formed by spin coating on a bare silicon substrate. Thereafter, the substrate was then rinsed with dibutyl ether, which is the same solvent as used in the resin composition, to remove an uncured part in the resin film to form a cured layer.

The width of the line pattern thus obtained was measured and was found to be 87 nm.

Next, etching treatment was carried out with a plasma etching apparatus (NE5000 (tradename) manufactured by ULVAC, Inc.). In this etching step, the cured layer in its part located on the upper part of the first convex pattern and in the lower layer part located between the convexes in the first convex pattern was removed to form a second convex pattern on the side wall of the first convex pattern. The etching was carried out with a mixed gas of $CF_4/O_2$ (flow ratio of each component: 20/20 sccm) under conditions of process pressure 5.0 Pa and antenna power 500 W. The etching time was 20 sec. The height of the pattern was 80 nm.

Subsequently, the space part of the obtained pattern was spin-coated with the ArF photoresist AZ AX2110P to be embedded. The height of the embedded part was 80 nm, which was as high as the pattern.

The obtained embedded part was then subjected to the step for removing the second convex pattern. The step was carried out by means of the above etching apparatus in an atmosphere of $CF_4/O_2$ mixed gas (flow ratio of each component: 20/20 sccm) under conditions of process pressure 5.0 Pa and antenna power 500 W. The etching time was 15 sec.

The pattern after the etching was observed under a scanning electron microscope (S4700 (tradename) manufactured by Hitachi, Ltd.). As a result, the number of patterns observed was twice of the first convex patterns. The line width was 18 nm.

The $SiO_2$ film as the film to be treated was etched by means of the above etching apparatus in an atmosphere of $CF_4/O_2$ mixed gas (flow ratio of each component: 20/20 sccm) under conditions of process pressure 5.0 Pa and antenna power 500 W. The etching time was 30 sec. In this etching procedure, first the bottom antireflection film was removed and thereafter the film to be treated was etched.

The pattern after the etching was observed under a scanning electron microscope (S4700 (tradename) manufactured by Hitachi, Ltd.). As a result, a line width of a $SiO_2$ pattern observed was 19 nm.

The invention claimed is:

1. A method for forming a superfine-patterned mask, comprising the steps of:
    preparing a base substrate on which a film to be treated is layered;
    forming, on the film to be treated, a first convex pattern having a convex portion;
    coating the first convex pattern with a resin composition comprising a resin comprising repeating units each having a silazane bond; wherein the repeating units are a combination of —(SiH$_2$—NH)— and —(SiH$_2$—N)< repeating units with —SiH$_3$ end group; and further;
    heating the base substrate which has been subjected to the coating step, to cure the resin composition present in an area adjacent to the convex portion;
    rinsing the base substrate which has been subjected to the curing step, to remove an uncured resin composition;
    removing part of a cured resin composition on the upper surface of the convex portion, to form on the side wall of the convex portion; a layer of a material different from the material of the first convex pattern; and
    removing the convex portion, to form a superfine second convex patterned mask of the different material.

2. The method according to claim 1, wherein the first convex pattern is formed of a photoresist.

3. The superfine-patterned mask formed by the method according to claim 1.

4. The method for forming a superfine pattern, comprising the step in which the film to be treated is etched by use of the superfine-patterned mask according to claim 3 as an etching mask.

5. A method for forming a superfine-patterned mask, comprising the steps of:
    preparing a base substrate on which a film to be treated and an intermediate film for treatment assistance are layered in order;
    forming, on the intermediate film for treatment assistance, a first convex pattern having a convex portion;
    coating the first convex pattern with a resin composition comprising a resin comprising repeating units each having a silazane bond; wherein the repeating units are a combination of —(SiH$_2$—NH)— and —(SiH$_2$—N)< repeating units with —SiH$_3$ end group; and further;
    heating the base substrate which has been subjected to the coating step, to cure the resin composition present in an area adjacent to the convex portion;
    rinsing the base substrate which has been subjected to the curing step, to remove an uncured resin composition;
    removing part of a cured resin composition on the upper surface of the convex portion, to form on the side wall of the convex portion a layer of a material different from the material of the first convex pattern;
    removing the first convex pattern, to form a superfine second convex patterned mask of the different material; and
    etching the intermediate film for treatment assistance through the second convex patterned mask, to form a superfine-patterned mask for fabricating the film to be treated.

6. The method according to claim 5, wherein the first convex pattern is formed of a photoresist.

7. A method for forming a superfine-patterned mask, comprising the steps of:
    preparing a base substrate on which a film to be treated is layered;
    forming, on the film to be treated, a first convex pattern having a convex portion; coating the first convex pattern with a resin composition comprising a resin comprising repeating units each having a silazane bond; wherein the repeating units are a combination of —(SiH$_2$—NH)— and —(SiH$_2$—N)< repeating units with —SiH$_3$ end group; and further;
    heating the base substrate which has been subjected to the coating step, to cure the resin composition present in an area adjacent to the convex portion;
    rinsing the base substrate which has been subjected to the curing step, to remove an uncured resin composition;
    removing part of a cured resin composition on the upper surface of the convex portion, to form on the side wall of the convex portion a layer of a material different from the material of the first convex pattern;
    embedding spaces with the material substantially same as the material of the first convex pattern, to form a pattern complementary to the first convex pattern; and
    removing the layer of the different material, to form a superfine-patterned mask consisting of the first convex pattern and the complementary pattern.

8. The method according to claim 7, wherein the first convex pattern is formed of a photoresist.

9. A method for forming a superfine-patterned mask, comprising the steps of:
    preparing a base substrate on which a film to be treated and an intermediate film for treatment assistance are layered in order;
    forming, on the intermediate film for treatment assistance, a first convex pattern having a convex portion;
    coating the first convex pattern with a resin composition comprising a resin comprising repeating units each having a silazane bond; wherein the repeating units are a combination of —(SiH$_2$—NH)— and —(SiH$_2$—N)< repeating units with —SiH$_3$ end group; and further;
    heating the base substrate which has been subjected to the coating step, to cure the resin composition present in an area adjacent to the convex portion;
    rinsing the base substrate which has been subjected to the curing step, to remove an uncured resin composition;
    removing part of a cured resin composition on the upper surface of the convex portion, to form on the side wall of the convex portion a layer of a material different from the material of the first convex pattern;
    embedding spaces between said convex portion with the material substantially same as the material of the first pattern, to form a pattern complementary to the first convex pattern;
    removing the layer of the different material, to form a superfine-patterned mask consisting of the first convex pattern and the complementary pattern; and
    etching the intermediate film for treatment assistance through the first convex pattern and the complementary pattern, to form a superfine-patterned mask for fabricating the film to be treated.

10. The method according to claim 9, wherein the first convex pattern is formed of a photoresist.

* * * * *